United States Patent [19]

Prak

[11] Patent Number: 4,645,947
[45] Date of Patent: Feb. 24, 1987

[54] CLOCK DRIVER CIRCUIT

[75] Inventor: Jan Prak, Los Gatos, Calif.

[73] Assignee: Intel Corporation, Santa Clara, Calif.

[21] Appl. No.: 810,036

[22] Filed: Dec. 17, 1985

[51] Int. Cl.⁴ .............................................. H03K 5/13
[52] U.S. Cl. .................................... 307/269; 307/262;
307/601; 307/605; 328/55; 328/62; 328/63;
377/105
[58] Field of Search ............... 307/262, 263, 269, 600,
307/601, 602, 603, 605, 590, 594, 595; 328/55,
57, 59, 60, 62, 63; 377/104, 105

[56] References Cited

U.S. PATENT DOCUMENTS

| | | | |
|---|---|---|---|
| 3,996,478 | 12/1976 | Kasperkovitz | 377/104 |
| 4,140,927 | 2/1979 | Feucht | 307/262 |
| 4,394,586 | 7/1983 | Morozumi | 377/105 |
| 4,456,837 | 6/1984 | Schade, Jr. | 307/269 |
| 4,472,645 | 9/1984 | White | 307/601 |

*Primary Examiner*—Stanley D. Miller
*Assistant Examiner*—Trong Quang Phan
*Attorney, Agent, or Firm*—Blakely, Sokoloff, Taylor & Zafman

[57] ABSTRACT

A driver circuit for generating non-overlapping clocking signals. A single clocking source is divided down into two clock signals which are passed through a plurality of inverter delay chains to insure non-overlapping output signals. Inverters made up of CMOS transistors having long channel lengths are utilized in order to eliminate overlap between the clock signals. Inverter delay chains are also utilized to prevent skewing between a true clock output signal and its complement.

14 Claims, 5 Drawing Figures

CLOCK DRIVER CIRCUIT

BACKGROUND OF THE INVENTION

1. Field of the Invention

This invention relates to the field of driver circuits for generating non-overlapping clock output signals.

2. Background Art

In an integrated circuit device, it is often desired to utilize a plurality of clocking signals for various portions of the circuit. In order to maximize efficiency, it is preferred to generate all clocking signals used on the integrated circuit from a single clock input. In the prior art, this was accomplished by coupling a clock input signal to a divider circuit, which had one or more output signals of varying frequencies. In order to effectively use these multiple clocking signals, it is necessary to drive them so that they are non-overlapping. In the past, this was accomplished by using cross-coupled or gates. A disadvantage of this prior art method is the susceptibility of such gates to process variations. Additionally, when the clocking signals included phases which were complements of other phases, a large amount of skew was introduced between the true signal and the complement of that signal.

Therefore, it is an object of the present invention to provide a driver circuit which results in the output of non-overlapping clocking signals.

It is further an object of the present invention to provide a driver circuit which is process insensitive.

It is yet another object of the present invention to provide a clock driver circuit which results in a minimum of skew between a true signal and its complement.

It is still a further object of the present invention to provide a clock driver circuit which results in improved and efficient operation.

SUMMARY OF THE PRESENT INVENTION

The present invention utilizes inverter delay chains as part of a driver circuit for clock outputs. In the preferred embodiment, long channel CMOS inverters are utilized in a portion of the delay chain. These inverters are process insensitive and result in non-overlapping signals. The present invention also eliminates skew between the true and complementary clock signals. The preferred embodiment of the present invention utilizes feedback loops which enable a first signal to control the delay of a second signal. This ensures that one signal will not begin to rise until the other signal has fallen.

DETAIL DESCRIPTION OF THE PRESENT INVENTION

A clock driver circuit is described. In the following description, numerous specific details are set forth, such as clock frequency, channel length, etc., in order to provide a more thorough understanding of the present invention. It will be obvious, however, to one skilled in the art, that the present invention may be practiced without these specific details. In other instances, well known circuits have not been shown in detail in order not to unnecessarily obscure the present invention.

Figure 1:
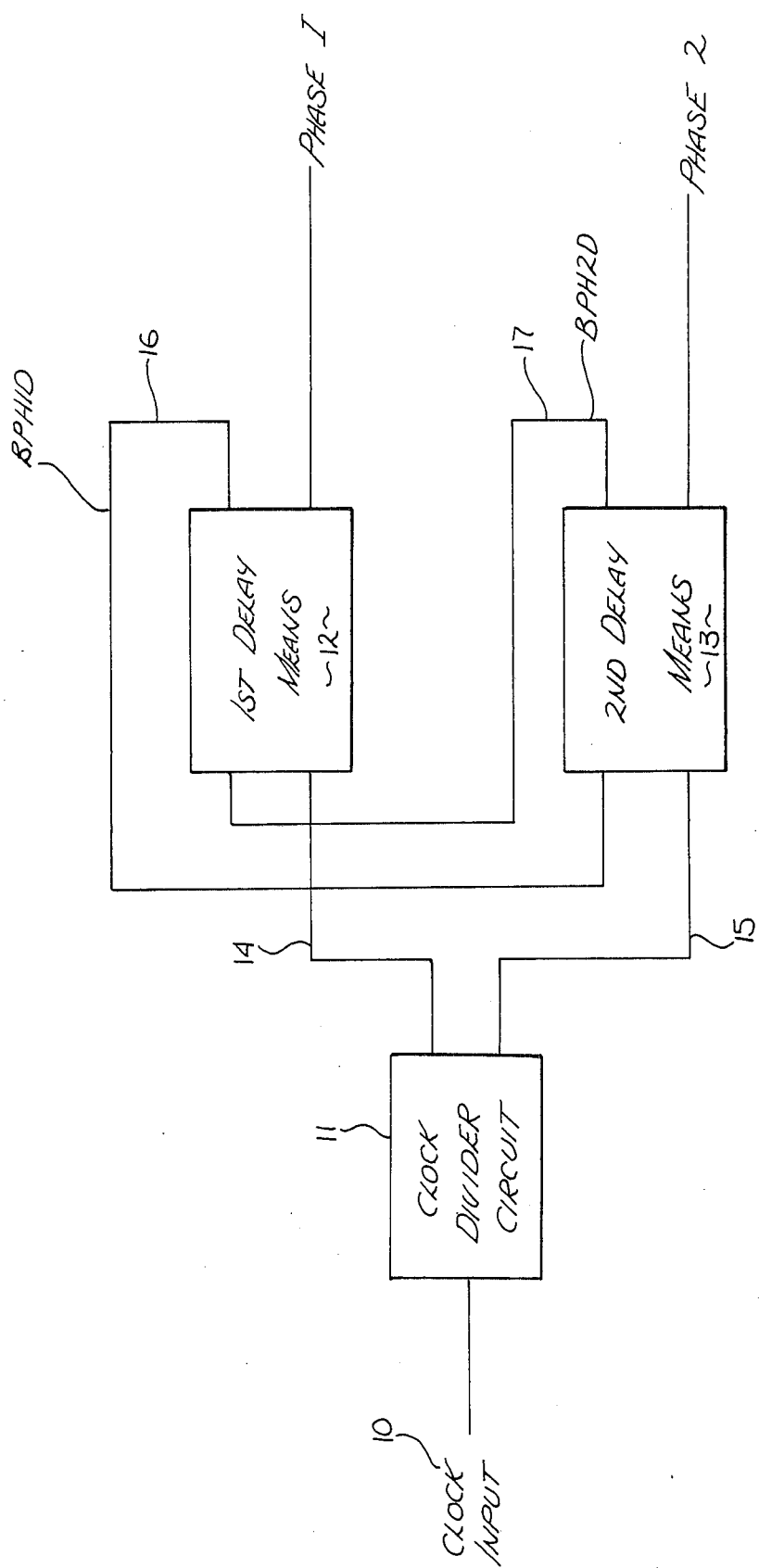
FIG. 1 is a block diagram illustrating the layout of the present invention.

Referring to FIG. 1, a block diagram showing the basic layout of the present invention is illustrated. In the preferred embodiment, a single clock input is utilized. The clock input may be from a crystal oscillator or any other source which can generate a clock pulse with the desired degree of accuracy. The clock input 10 is coupled to a clock divider circuit 11. The purpose of the clock divider circuit is to produce two or more clocking signals of different frequencies from the single clock input source and to insure a precise equality of the resulting clock phases. A variety of divider circuits are well known in the art, and any suitable divider circuit may be utilized with the present invention.

In the preferred embodiment of the present invention, the clock divider circuit has two outputs. The first output, on line 14, is a clocking signal utilized to generate the phase one clocking signal of the circuit. The second clocking signal, on line 15, is utilized to generate the phase two clocking signal. Although in the preferred embodiment, only two clocking signals are discussed, it will be obvious, to one skilled in the art, that the present invention may be practiced with a plurality of clocking signals as required by the particular application in which the present invention is utilized.

The first clocking signal on line 14 is coupled to a first delay means 12 and the second clocking signal, on line 15, is coupled to a second delay means 13. The first delay means 12 has two outputs, the phase one clocking signal and a delay signal BPH1D on line 16. The BPH1D signal is inputted to the second delay means 13 along with the second clocking signal 15. The BPH1D signal prevents the phase two clocking signal from overlapping the phase one clocking signal. The second delay means, in addition to outputting the phase two clocking signal outputs a delay signal BPH2D on line 17 which is inputted into the first delay means 12 to prevent the overlap of the phase one clocking signal with the phase two clocking signal. BPH1D and BPH2D are feedback signals which delay the rising edge of one signal until the other signal has fallen. The result is the wave form shown by the phase one and phase two lines of FIG. 5. There is a delay, represented by line 60, introduced by the feedback loop, between the falling edge of the phase two signal and the rising edge of the phase one signal so that the phase one signal and the phase two signal do not overlap.

Figure 2:
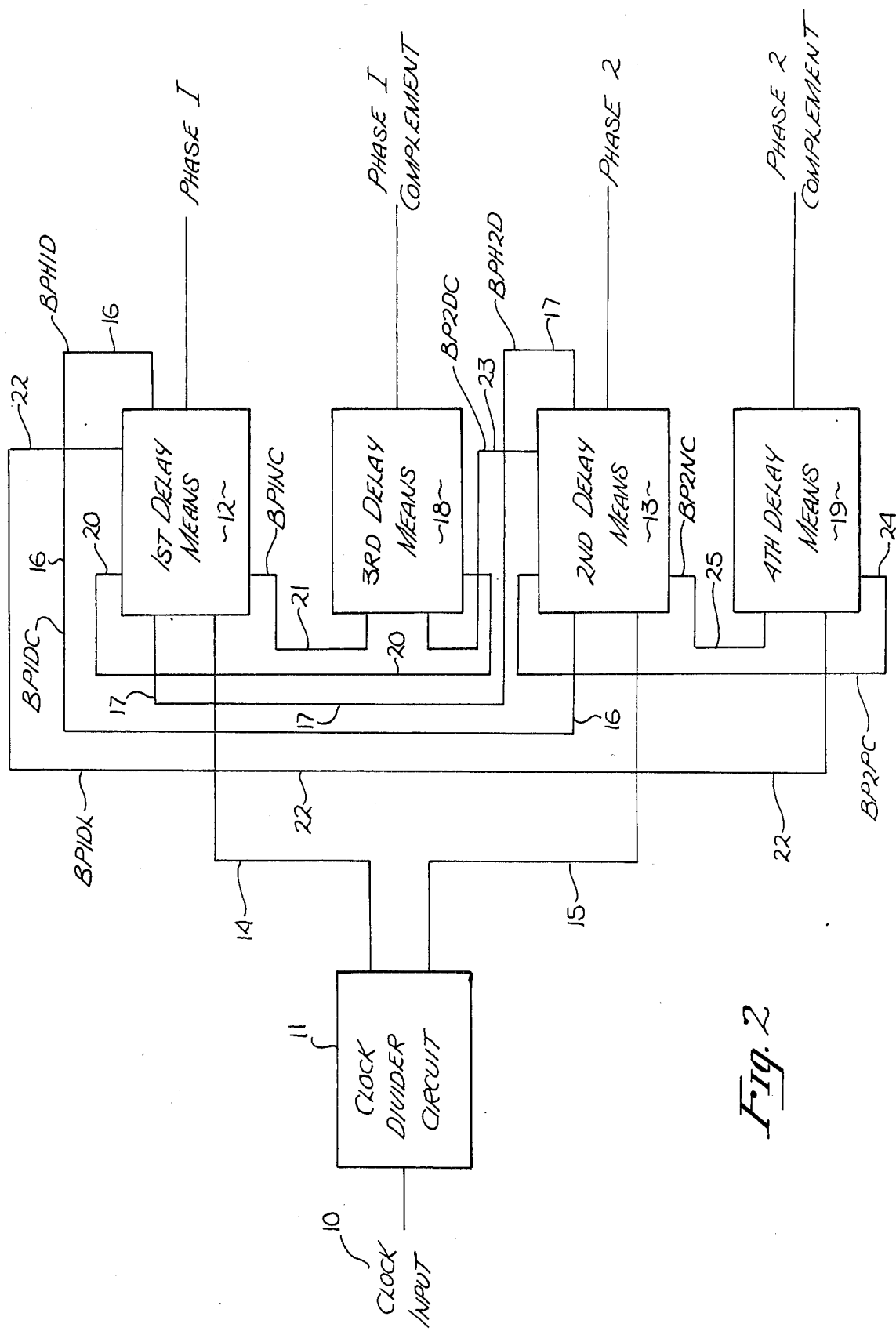
FIG. 2 is a block diagram illustrating the layout of the present invention when used to generate complementary signals.

In some applications, CMOS technology in particular, a four phase clocking arrangement using two true signals and the complements of those signals are utilized. Such a configuration utlizing the present invention is illustrated in FIG. 2. Again, a single clock input 10 is coupled to a clock divider circuit 11, producing two output signals on lines 14 and 15. In addition to the first and second delay means 12 and 13, third and fourth delay means 18 and 19 are utilized to prevent overlapping of the complements of the phase one and phase two clocking signals. The first clock signal on line 14 is coupled to the input of the first delay means 12 along with the BPH2D signal on line 17 (generated by second delay means 13). In this configuration, in addition to outputting the phase one clocking signal and the BPH1D signal on line 16, the first delay means 12 outputs a BP1PC (phase one complement) signal on line 20 which is coupled to third delay means 18 and a BP1NC signal on line 21 which is also inputted into the third delay means 18. Finally, first delay means 12 also outputs on line 22 a BP1DL signal which is inputted to the fourth delay means 19.

The second delay means 13, in addition to outputting the phase two signal and the BPH2D signal on line 17, outputs a BP2DL signal on line 23, a BP2PC (phase two complement) signal on line 24 and a BP2NC signal on line 25.

Figure 5:
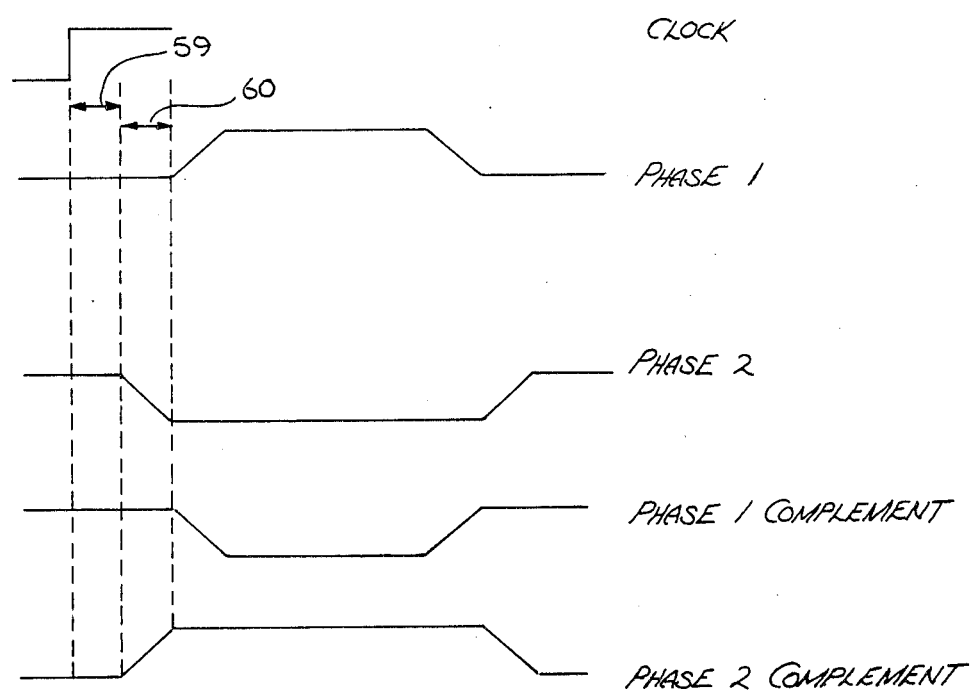
FIG. 5 is a timing diagram illustrating the output signals of the present invention.

The third delay means, whose inputs are BP1NC on line 21, BP2DL on line 23 and BP1PC on line 20, outputs the phase one complement signal. The fourth delay means 19, whose inputs are the BP2NC signal on line 25, the BP1DL signal on line 22 and the BP2PC signal on line 24, outputs the phase two complement signal. The output of this configuration is illustrated in FIG. 5 by the phase one, phase two, phase one and phase two signals.

TRUE SIGNAL DELAY MEANS

The first and second delay means, 12 and 13, are used to prevent overlapping of the true signals, phase one and phase two. Both delay means are identical, and utilize inverter chains to introduce delays into the first and second clocking signals to prevent overlapping of the output phase one and phase two signals. The first delay means 12 is shown in greater detail in FIG. 3 and the description there applies equally to the second delay means 13.

Figure 3:
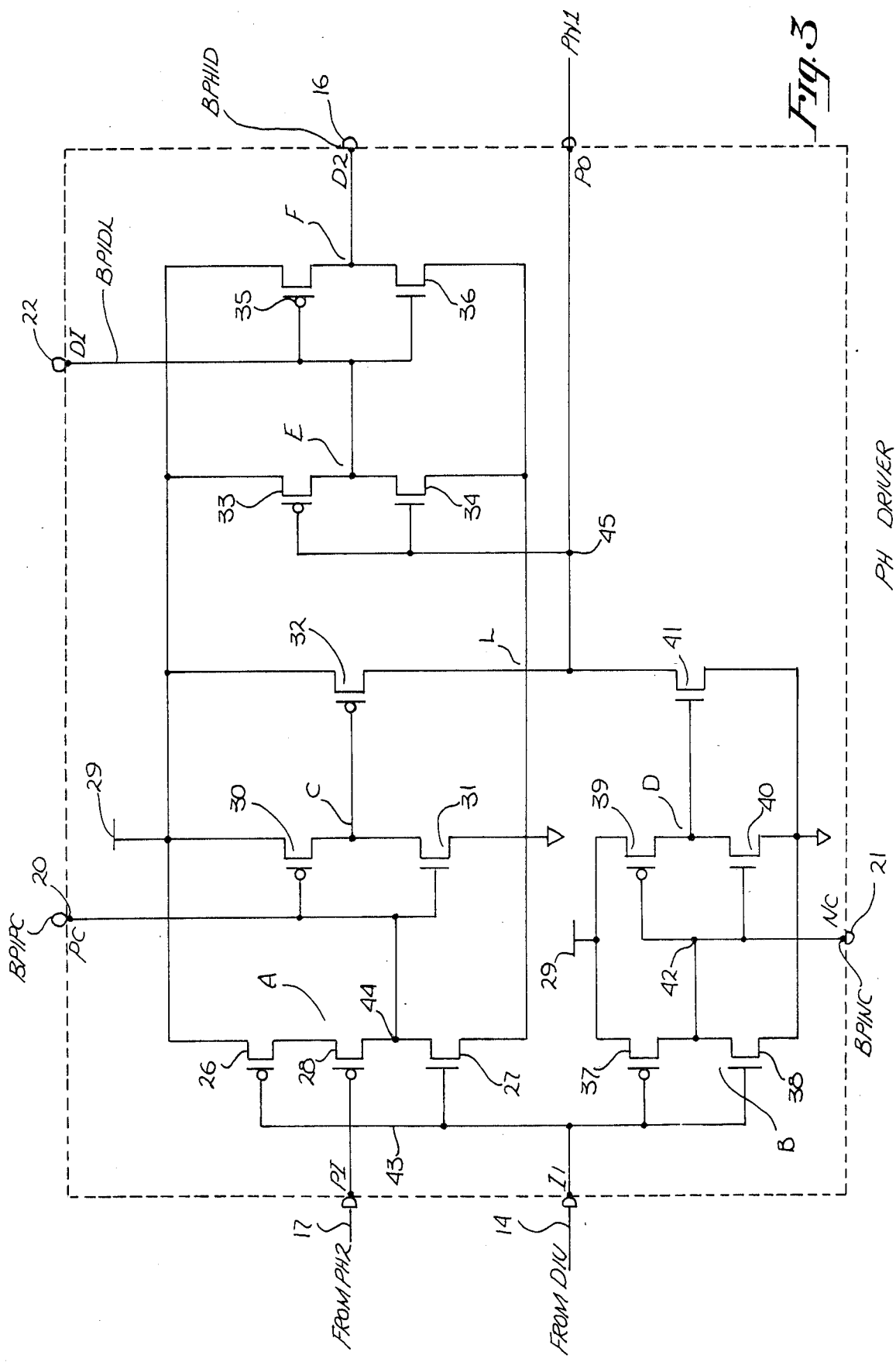
FIG. 3 is a circuit diagram illustrating the true signal delay means.

Referring to FIG. 3, we see that the first clock signal on line 14 is coupled to a pair of inverter chains. The first inverter chain is comprised of inverters A and C while the second chain is comprised of inverters B and D. The outputs of these two chains are inputted to inverter L, with the output of inverter L being the phase one clocking signal. Inverter A is made up of P transistor 26 and N transistor 27. The gate of transistor 28 is coupled to the BPH2D signal from the second delay means 13 on line 17. The source of transistor 26 is coupled to a voltage supply 29 (in the preferred embodiment 4 to 6 volts) and the source of transistor 27 is coupled to ground.

A P transistor 28, connecting the drain of transistor 26 to the output of inverter A, controls the high going transistor of node 44. The output of inverter A at node 44 is coupled to inverter C comprised of P transistor 30 and N transistor 31. The gates of transistors 30 and 31 are coupled to node 44. The source of transistor 30 is coupled to voltage source 29 while the source of transistor 31 is coupled to ground.

The output of inverter C is coupled to the gate of P transistor 32 of inverter L whose source is coupled to voltage source 29 and whose drain is coupled to node 45. Inverter L also includes N transistor 42. The drain of transistor 41 is coupled to node 45 while the source of transistor 41 is coupled to ground. The gate of transistor 42 is coupled to the output of inverter D. Inverter B is comprised of P channel transistor 37 drain coupled to N transistor 38. Inverter D is comprised of P channel transistor 39 drain coupled to N transistor 40. The sources of transistors 37 and 39 are coupled to voltage source 29 while the sources of transistors 38 and 40 are coupled to ground.

Because the phase one clocking signal at node 45 is controlled by P channel transistor 32, whose gate voltage is high when the first clock signal on line 14 is high, the phase one clock signal will be low when the first clock signal on line 14 is high and the phase one clock signal will be high when the first clock signal on line 14 is low. In operation, when the phase two output signal begins to fall, the first clock signal on line 14 will already have fallen. The BPH2D signal coupled to P transistor 28 on line 17 remains high since it is passed through a two inverter delay circuit in a manner similar to the BPH1D signal on line 16. As a result, even though the signal on line 43 is low, the output of inverter A is low as well (and the output of inverter C is high).

After the delay time established by the BPH2D inverter delay chain, the signal on line 17 drops turning on transistor 28 and resulting in a high output at node 44. This output is coupled to inverter C and results in a low output. This low output of inverter C turns on transistor 32 whose source is coupled to voltage source 29. This results in a high signal at node 45 and a high phase one output signal. The low signal on line 14 is pushed through inverters B and D more rapidly than through inverters A and C. This results in a low signal at transistor 42, shutting it off and isolating node 45 from ground. When the input signal on line 14 begins to rise, inverters A and C turn off transistor 32 while inverters B and D turn on transistor 41, coupling node 45 to ground and causing the phase one output signal to drop. The operation is similar for the second delay means 13.

The BPH1D signal, coupled to the second delay means 18, is generated by coupling the phase one clocking signal through another pair of inverters E and F. Node 45 is coupled to the gates of P transistor 33 and N transistor 34. The source of transistor 33 is coupled to voltage source 29 while the source of transistor 34 is coupled to ground. The output of this inverter E is coupled to inverter F comprised of P transistor 35 and N transistor 36. The source of P transistor 35 is coupled to voltage source 29 and the source of transistor 36 is coupled to ground. Output line 16 is coupled to the drains of transistor 35 and 36 and is the BPH1D signal.

In order to make the present invention process insensitive, long channel lengths are chosen for the inverters E and F. For example, in the preferred embodiment, the channel length of the transistors comprising inverters E and F is approximately 3 microns. The long channel lengths allow for process insensitivity, and more reliable operation so as to insure non-overlapping output clocking signals.

Additional signals necessary when the present invention is used in conjunction with phase complement outputs are generated by the circuitry of the first and second delay means. The first delay means of FIG. 3 also generates a BP1DL signal for delaying the output of the phase two complement, a PB1PC signal which is the delayed complement of the phase one signal and a BP1NC signal, the complement of the input clock signal on line 14. The BP1DL signal on line 22 is taken from the output of inverter E formed by transistors 33 and 34. The PB1PC signal on line 20 is taken from node 44. The BP1NC signal on line 21 is taken from output of the inverter B at node 42. When the first clock input signal on line 14 is low, the BP1NC signal on line 21 is high.

PHASE COMPLEMENT DELAY MEANS

Figure 4:
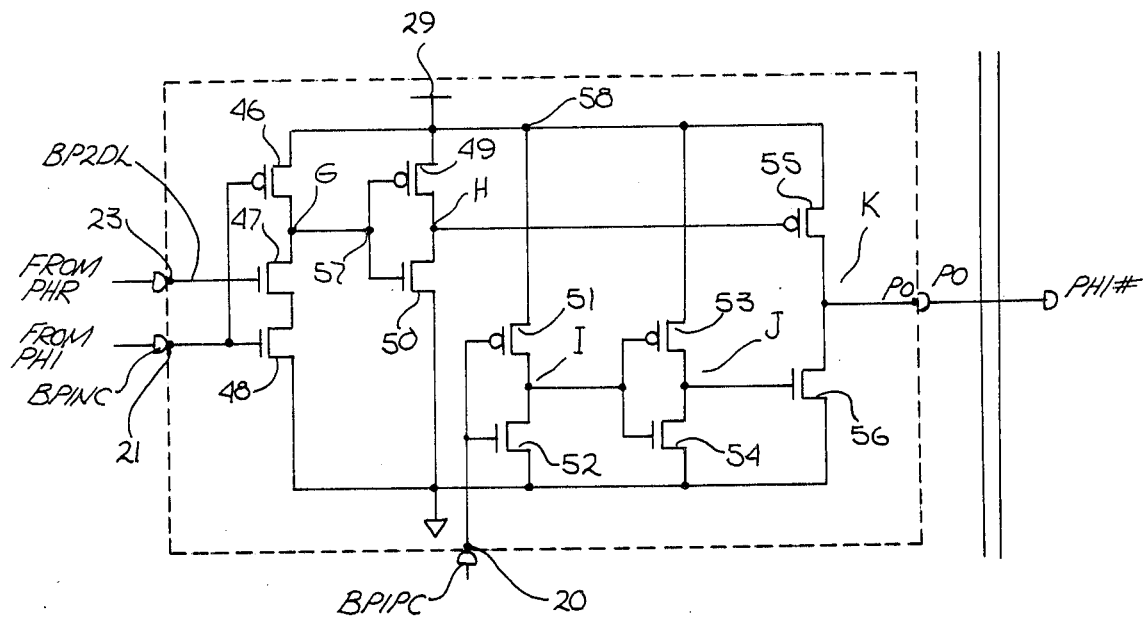
FIG. 4 is a circuit diagram illustrating the complementary signal delay means.

The third and fourth delay means, are comprised of identical circuitry and are used to insure non-overlapping phase complement signals and to prevent skew between the true signal and its complement. Referring to FIG. 4, a detailed circuit diagram illustrating the third delay means 18 is illustrated. In the preferred embodiment of the present invention, the circuitry for the third delay means 18 and the fourth delay means 19 is identical. The phase one complement signal is generated by inverter K, comprised of P transistor 55 drain coupled to N transistor 56. The source of P transistor 55 is coupled to voltage source 29 while the source of transistor 56 is coupled to ground. The gate of transistor 55 is coupled to the BP1NC signal after it is passed through inverters G and H. The gate of transistor 56 is coupled to the BP1PC signal after it is passed through inverters I and J.

The BP1NC signal on line 21 is coupled to inverter G comprised of P transistor 46 and N transistor 48. The output of inverter G is coupled to a second inverter H comprised of P transistor 49 and N transistor 50. The sources of P transistors 46 and 49 are coupled to voltage source 29 and the sources of N transistors 48 and 50 are coupled to ground. An N transistor 47 is coupled across the output of inverter G with the drain of transistor 47 coupled to the drain of transistor 46 and the source of transistors 47 coupled to the drain of transistor 48.

The gate of transistor 47 is coupled to the PB2DL signal on line 23 which is generated by the second delay means 13. When the first clock input signal on line 14 is low, which would generate a high phase one clocking signal, the BP1NC signal 21 is high, having passed through inverter B of first delay means 12. Normally this high input to inverter G results in a low output. However, the output of inverter G is controlled by transistor 47. The BP2DL signal on line 23 is low for a delay period holding the output of inverter G high. At the end of that delay period, BP2DL signal on line 23 goes high turning on transistor 47 and making the output of inverter G low. This low output becomes the input to inverter H whose output is correspondingly high. This high output of inverter H is coupled to inverter K. Inverter K is comprised of P channel transistor 55 and N channel transistor 56. The output of Inverter H is coupled to the gate of transistor 55. When the output of inverter H is high, transistor 55 is turned off, making the output of Inverter K (phase one), low.

A pair of inverters, inverter I and inverter J, are coupled to the BP1PC signal on line 20. Inverter I is comprised of P transistor 51 and N transistor 52 while inverter J is comprised of P transistor 53 and N transistor 54. The sources of P transistor 51 and 53 are coupled to voltage source 29 while the sources of transistors 52 and 54 are coupled to ground. BP1PC signal is low when the first clock input signal on line 14 is low. This signal, after passing through inverters I and J, is therefore low and is coupled to the gate of N transistor 56 in inverter K. The source of N transistor 56 is coupled to ground and the drain of transistor 56 is coupled to the drain of P transistor 55 which is the phase one output. Transistor 56 is turned on creating a path to ground and insuring that the phase one output is pulled low, synchronously with the phase one output going high.

Thus, a driver circuit for driving a clock generator having four phase non-overlapping outputs has been described.

I claim:

1. A clock driver circuit for producing non-overlapping output signals, said circuit comprising:
   a frequency divider means coupled to a first clock signal, said frequency divider means having as outputs second and third clock signals;
   a first delay means generating fourth and fifth signals;
   a second delay means generating sixth and seventh signals;
   said first delay means coupled to said second clock signal and said seventh signal, said first delay means introducing a delay between a falling edge of said sixth signal and a rising edge of said fourth signal;
   said second delay means coupled to said third clock signal and said fifth signal, said second delay means introducing a delay between a falling edge of said fourth signal and a rising edge of said sixth signal.

2. The circuit of claim 1 wherein said first delay means comprises:
   first and second inverters coupled between the input of said first inverter and the output of said second inverter, said first inverter input coupled to said second clock signal;
   third and fourth inverters coupled between the input of said third inverter and the output of said fourth inverter, said third inverter input coupled to said second clock signal;
   the output of said second and fourth inverters coupled to a fifth inverter, the output of said fifth inverter being said fourth signal;
   sixth and seventh inverters coupled between the input of said sixth inverter and the output of said seventh inverter, said sixth inverter coupled to said fourth signal, the output of said seventh inverter being said fifth signal.

3. The circuit of claim 1 wherein said second delay means comprises:
   eighth and ninth inverters coupled between the input of said eighth inverter and the output of said ninth inverter, said eighth inverter input coupled to said third signal;
   tenth and eleventh inverters coupled between the input of said tenth inverter and the output of said eleven inverter, said tenth inverter input coupled to said third signal;
   the output of said ninth and eleventh inverters coupled to a twelfth inverter, the output of said twelfth inverter being said sixth signal;
   thirteenth and fourteenth inverters coupled between the input of said thirteenth inverter and the output of said fourteenth inverter, said thirteenth inverter input coupled to said sixth signal, the output of said fourteenth inverter being said seventh signal.

4. The circuit of claim 2 wherein said first inverter of said first delay means includes a first transistor having its gate coupled to said seventh signal.

5. The circuit of claim 3 wherein said eighth inverter of said second delay means includes a second transistor having its gate coupled to said fifth signal.

6. A clock driver circuit for producing non-overlapping output signals, said circuit comprising:
   a frequency divider means coupled to a first clock signal, said frequency divider means having as outputs second and third clock signals;
   a first delay means generating fourth and fifth signals;
   a second delay means generating sixth and seventh signals;
   said first delay means coupled to said second clock signal and said seventh signal, said first delay means introducing a delay between a falling edge of said sixth signal and a rising edge of said fourth signal;

said second delay means coupled to said third clock signal and said fifth signal said second delay means introducing a delay between a falling edge of said fourth signal and a rising edge of said sixth signal;

a third delay means coupled to said first and second delay means, said third delay means generating the complement of said fourth signal;

a fourth delay means coupled to said first and second delay means, said fourth delay means generating the complement of said sixth signal.

7. The circuit of claim 6 wherein said first delay means comprises:

first and second inverters coupled in series, said first inverter input coupled to said second clock signal;

third and fourth inverters coupled between the inputs of said first inverter and the output of said second inverter, said third inverter input coupled to said second clock signal;

the output of said second and fourth inverters coupled to a fifth inverter, the output of said fifth inverter being said fourth signal;

sixth and seventh inverters coupled between the input of said sixth inverter and the output of said seventh inverter, said sixth inverter coupled to said fourth signal, the output of said seventh inverter being said fifth signal.

8. The circuit of claim 6 wherein said second delay means comprises:

eighth and ninth inverters coupled between the input of said eighth inverter and the output of said ninth inverter, said eighth inverter input coupled to said third clock signal;

tenth and eleventh inverters coupled between the input of said tenth inverter and the output of said eleventh inverter, said tenth inverter input coupled to said third clock signal;

the output of said ninth and eleventh inverters coupled to a twelfth inverter, the output of said twelfth inverter being said sixth signal;

thirteenth and fourteenth inverters coupled between the input of said thirteenth inverter and the output of said fourteenth inverter, said thirteenth inverter coupled to said sixth signal, the output of said fourteenth inverter being said seventh signal.

9. The circuit of claim 7 wherein said first inverter of said delay means includes first transistor having its gate coupled to said seventh signal.

10. The circuit of claim 8 wherein said eighth inverter of said second delay means includes a second transistor having its gate coupled to said fifth signal.

11. The circuit of claim 10 wherein said third delay means comprises:

fifteenth and sixteenth inverters coupled between the input of said fifteenth inverter and the output of said sixteenth inverter, said fifteenth inverter coupled to the output of said third inverter;

seventeenth and eighteenth inverters coupled between the input of said seventeenth inverter and the output of said eighteenth inverter, said seventeenth inverter coupled to the output of said first inverter;

the outputs of said sixteenth and eighteenth inverters coupled to a nineteenth inverter, the output of said nineteenth inverter being the complement of said fourth signal.

12. The circuit of claim 11 wherein said fifteenth inverter of said third of delay means includes a third transistor having its gate coupled to the output of said thirteenth inverter.

13. The circuit of claim 10 wherein said fourth delay means comprises:

twentieth and twenty-first inverters coupled between the input of said twentieth inverter and the output of said twenty-first inverter, said twentieth inverter coupled to the output of said tenth inverter;

twenty-second and twenty-third inverters coupled between the input of said twenty-second inverter and the output of said twenty-third inverter, said twenty-second inverter coupled to the output of said eighth inverter;

the outputs of said twenty-first and twenty-third inverters coupled to a twenty-fourth inverter, the output of said twenty-fourth inverter being the complement of said sixth signal.

14. The circuit of claim 13 wherein said twentieth inverter of said fourth delay means includes a fourth transistor having its gate coupled to the output of said sixth inverter.

* * * * *